(12) United States Patent
Lee et al.

(10) Patent No.: US 6,232,232 B1
(45) Date of Patent: *May 15, 2001

(54) HIGH SELECTIVITY BPSG TO TEOS ETCHANT

(75) Inventors: Whonchee Lee; Kevin J. Torek, both of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/056,323

(22) Filed: Apr. 7, 1998

(51) Int. Cl.[7] ................................................. H01L 21/465
(52) U.S. Cl. ............................ 438/694; 438/700; 438/745
(58) Field of Search .................................. 438/745, 700, 438/694

(56) References Cited

U.S. PATENT DOCUMENTS

| | | |
|---|---|---|
| 5,094,900 | 3/1992 | Langley . |
| 5,296,400 | 3/1994 | Park et al. . |
| 5,300,463 | 4/1994 | Cathey et al. . |
| 5,340,765 * | 8/1994 | Dennison et al. ............... 437/52 |
| 5,364,813 * | 11/1994 | Koh ................................. 437/52 |
| 5,395,482 | 3/1995 | Onda et al. . |
| 5,405,802 | 4/1995 | Yamagata et al. . |
| 5,413,678 | 5/1995 | Hossain . |
| 5,436,188 * | 7/1995 | Chen ................................ 437/52 |
| 5,497,016 * | 3/1996 | Koh ............................... 257/306 |
| 5,510,645 | 4/1996 | Fitch et al. . |
| 5,543,346 | 8/1996 | Keum et al. . |
| 5,597,756 | 1/1997 | Fazan et al. . |
| 5,679,475 | 10/1997 | Yamagata et al. . |
| 5,780,338 * | 7/1998 | Jeng et al. ..................... 438/253 |
| 5,843,821 | 12/1998 | Tseng . |
| 5,869,403 * | 2/1999 | Becker et al. .................. 438/738 |
| 5,883,002 * | 3/1999 | Shih et al. ..................... 438/640 |

* cited by examiner

*Primary Examiner*—Benjamin Utech
*Assistant Examiner*—Vanessa Perez-Ramos
(74) *Attorney, Agent, or Firm*—Trask Britt

(57) ABSTRACT

An organic acid/fluoride-containing solution etchant having high selectivity for BPSG to TEOS. In an exemplary situation, a TEOS layer may be used to prevent contamination of other components in a semiconductor device by the boron and phosphorous in a layer of BPSG deposited over the TEOS layer. The etchant of the present invention may be used to etch desired areas in the BPSG layer, wherein the high selectivity for BPSG to TEOS of etchant would result in the TEOS layer acting as an etch stop. A second etch with a known etchant may be utilized to etch the TEOS layer. The known etchant for the second etch can be less aggressive and, thus, not damage the components underlying the TEOS layer.

16 Claims, 3 Drawing Sheets

HIGH SELECTIVITY BPSG TO TEOS ETCHANT

BACKGROUND OF THE INVENTION

1. Field of the Invention

The present invention relates to etchant formulations for semiconductor device production. More particularly, the present invention relates to an etchant formulation with high selectivity between BPSG and TEOS and methods for use of the formulation.

2. State of the Art

Etching is a process for removing material in a specific area through a wet (liquid) or dry (gaseous/vapor) chemical reaction, or by physical removal (such as by sputter etch, in which the specific area is bombarded with radio frequency-excited ions to knock atoms from the specific area). Etching is used in a variety of applications in the fabrication of semiconductor devices. For illustration purposes, vapor etching of bit line openings for a DRAM (Dynamic Random Access Memory) will be discussed.

A widely-utilized DRAM manufacturing process utilizes CMOS (Complimentary Metal Oxide Semiconductor) technology to produce DRAM circuits, which circuits comprise an array of unit memory cells, each typically including one capacitor and one transistor, such as a field effect transistor ("FET"). In the most common circuit designs, one side of the transistor is connected to one side of the capacitor, the other side of the transistor and the transistor gate are connected to external circuit lines called the bit line and the word line, and the other side of the capacitor is connected to a reference voltage that is typically one-half the internal circuit voltage. In such memory cells, an electrical signal charge is stored in a storage node of the capacitor connected to the transistor which charges and discharges the circuit lines of the capacitor.

It is known that hydrofluoric acid can be used as an etchant and is selective for BPSG to TEOS. In fact, the selectivity for BPSG to TEOS with hydrofluoric acid alone can be as high as 1000:1 in vapor etch and as low as less than 10:1 for dilute hydrofluoric acid solutions. However, there are some disadvantages associated with vapor etch such as high particle counts and low productivity. Consequently, a wet etchant which could perform the role of high selective vapor would be advantageous.

Therefore, it would be desirable to develop an etchant and a method of use which would eliminate the risk of damaging the surface of the semiconductor substrate without having to use an etch stop layer.

SUMMARY OF THE INVENTION

The present invention relates to an organic acid/fluoride-containing solution etchant formulation having high selectivity for BPSG to TEOS and methods for its use in the production of semiconductor devices.

It has been found that the addition of an organic acid (such as acetic acid, formic acid, and oxalic acid) to a fluoride-containing solution (such as hydrofluoric acid and ammonium fluoride) dramatically increases selectivity of BPSG to TEOS without the above-mentioned disadvantages. As mentioned above, most applications with both BPSG and TEOS layers involve using the TEOS layer to prevent contamination of other components in a semiconductor device by the boron and phosphorous in the BPSG. Thus, a typical application consists of a layer of TEOS deposited over the semiconductor device components which require protection and a layer of BPSG applied over the TEOS layer. The etchant of the present invention may be used to etch desired areas in the BPSG layer. The high selectivity for BPSG to TEOS of etchant of the present invention would result in the TEOS layer acting as an etch stop. A second etch may be utilized to etch the TEOS layer. The etchant for the second etch can be less aggressive and, thus, not damage the components underlying the TEOS layer.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PREFERRED EMODIMENTS

As previously discussed, hydrofluoric acid is a known etchant for etching BPSG and TEOS. However, it has been found that the addition of an organic acid (such as acetic acid, formic acid, and oxalic acid) to a fluoride-containing solution (such as hydrofluoric acid and ammonium fluoride (preferably 40% $NH_4F$ in water)) dramatically increases selectivity of BPSG to TEOS. Most preferably, the etchant comprises an acetic acid/hydrofluoric acid mixture.

Etchants were formulated from glacial acetic acid (99.7% by weight in water) and hydrofluoric acid (49% by weight in water). The results (etch rate, selectivity and uniformity) of various etchant formulations are presented in Table 1, as follows:

TABLE 1

| Etchant (vol. ratio glacial acetic acid to 49% HF) | Etching rate through TEOS (Å/min) | Etching rate through BPSG (Å/min) | BPSG Standard Deviation (%) | Selective ratio (BPSG/TEOS) |
|---|---|---|---|---|
| 200:1 | 2.2 | 59 | 0 | 27 |
| 100:1 | 4.6 | 193 | 2.4 | 42 |
| 50:1 | 11.6 | 638 | 13.7 | 55 |

As it can be seen from Table 1, the selectivity and uniformity increased with increasing hydrofluoric acid concentration. The preferred etchant to obtain high selectivity and good uniformity is 100:1 volume ratio of 99.7% glacial acetic acid to 49% hydrofluoric acid. However, it is believed that etchant ratios ranging from 1:1 to 500:1 will achieve adequate selectivity.

Figure 1:
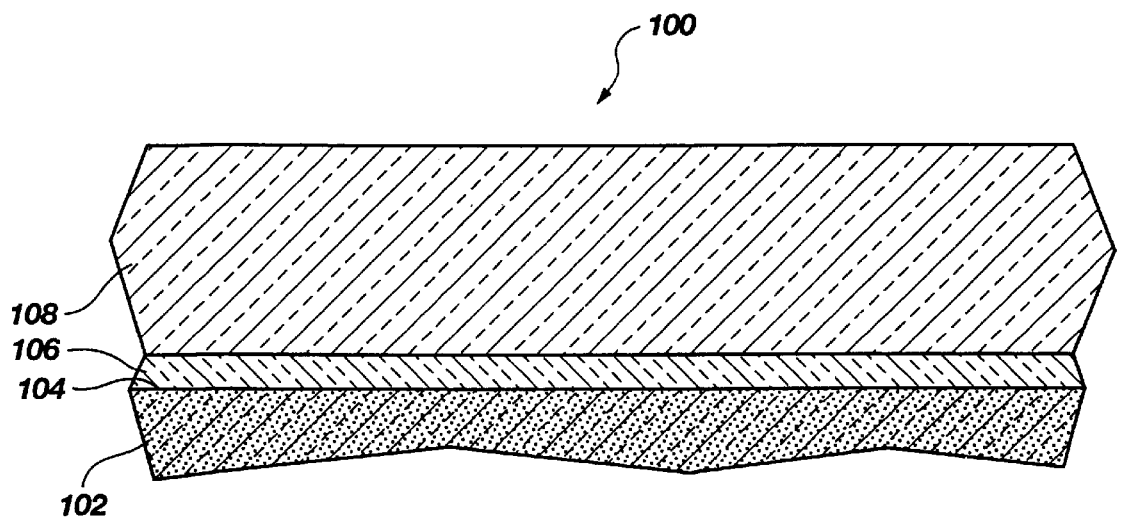
FIGS. 1, 2, 3, 4, 5 are side cross-sectional views of a method of forming an opening using an etchant according to the present invention.

FIGS. 1–5 illustrate a technique for utilizing an etchant of the present invention in the formation of an opening in a BPSG layer. FIG. 1 illustrates an intermediate structure 100 comprising a substrate 102 having a first side 104 with a first barrier layer 106 of TEOS applied thereover. A second barrier layer 108 of BPSG is deposited over the first TEOS barrier layer 106.

Figure 2:
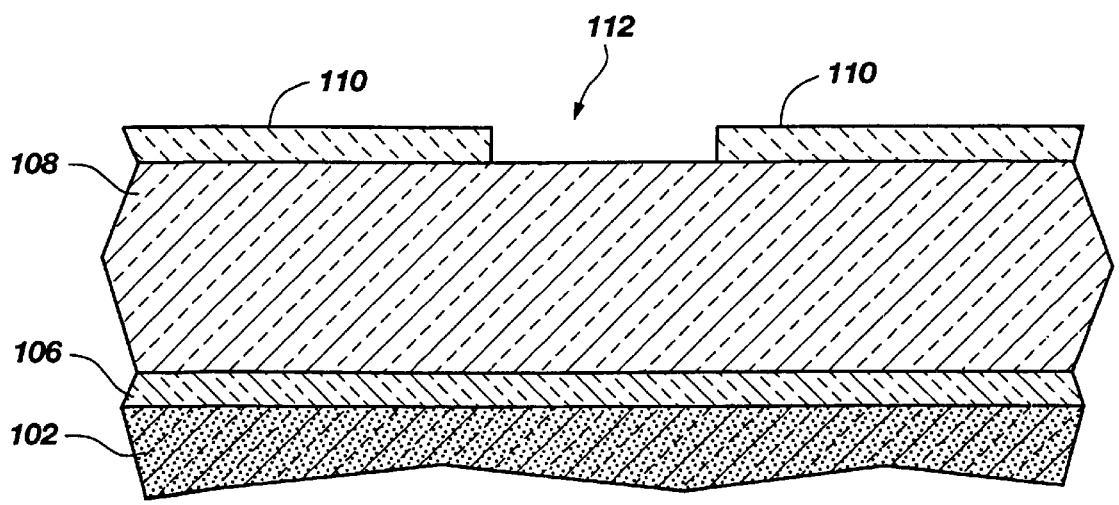
Figure 3:
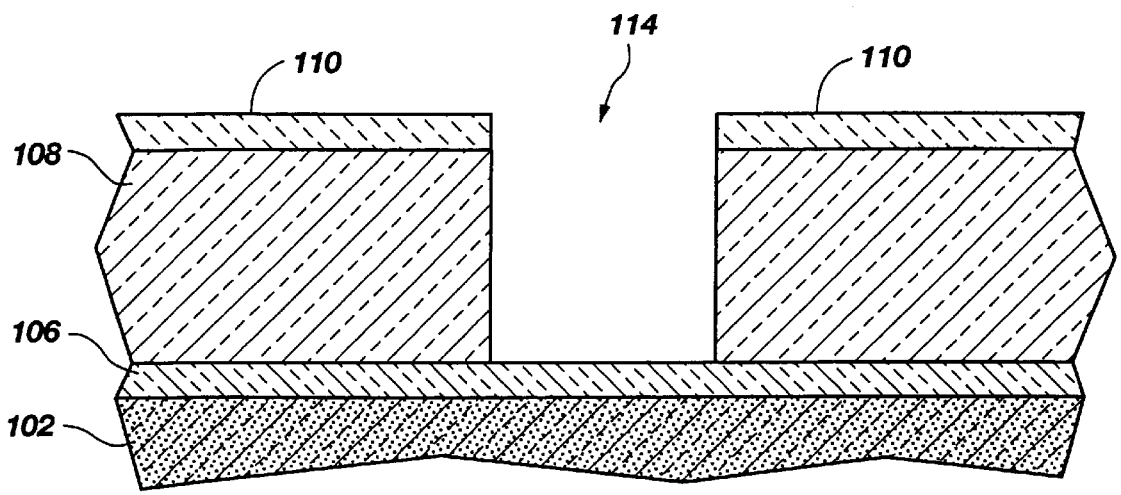
Figure 4:
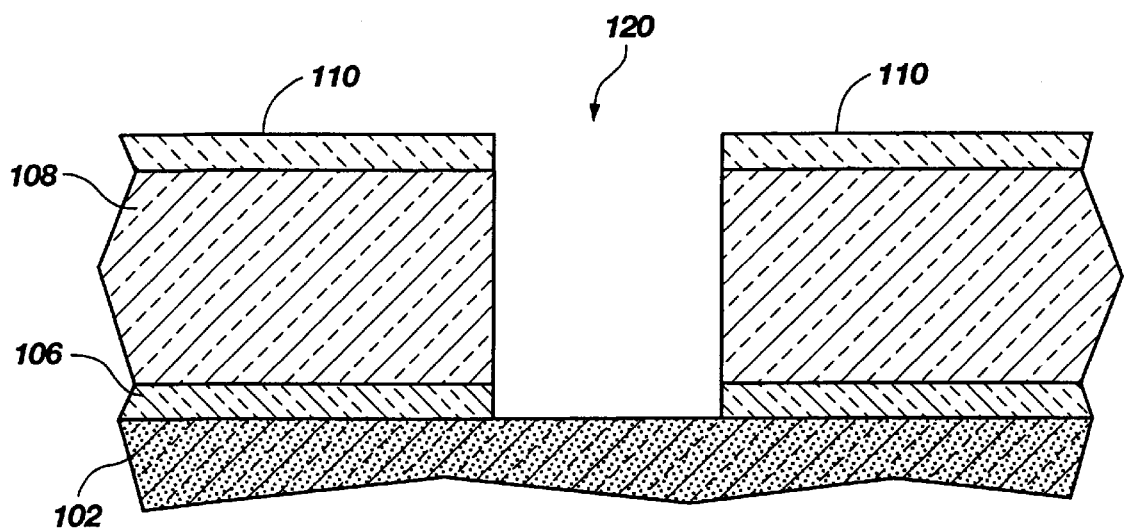
Figure 5:
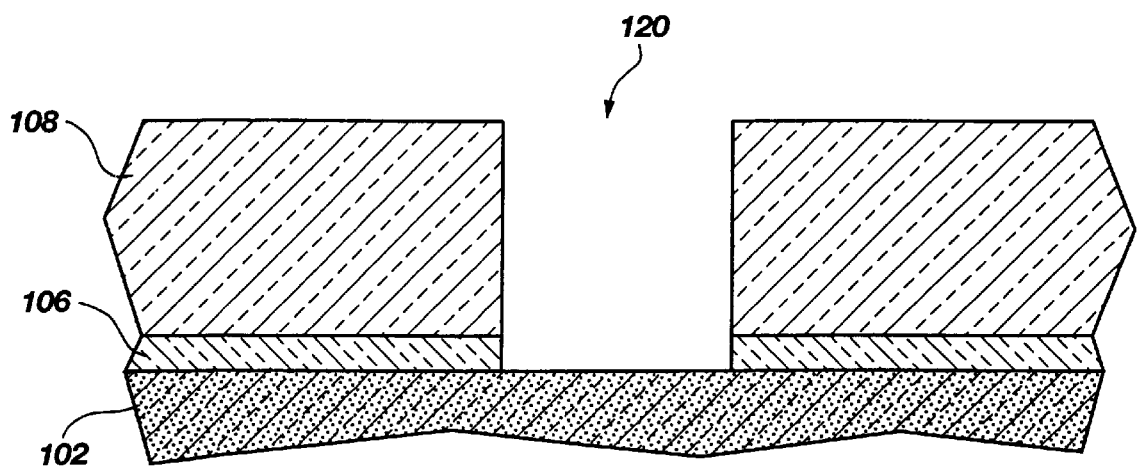

A nitride layer 110 is patterned over the second barrier layer 108 of BPSG and has at least one opening 112, as shown in FIG. 2. The second barrier layer 108 of BPSG is etched with an etchant of the present invention to form a partial opening 114. Since the etchant of the present invention is selective to BPSG, the etch effectively ceases at the first barrier layer 106 of TEOS, as shown in FIG. 3. The first barrier layer 106 of TEOS is then etched with a less aggressive etchant, such as a TMAH/hydrofluoric acid mixture or a 35–40% by weight ammonium fluoride/4–6% by weight phosphoric acid solution in water, which is less damaging to the substrate 100 to form a full opening 120, as shown in FIG. 4. The nitride layer 110 is stripped, as shown in FIG. 5.

It is, of course, understood that the etchant of the present invention can be utilized in any etching situation where selectivity of BPSG to TEOS barrier layers is desired, such as contact openings, container etching, and the like. Furthermore, the etchant of the present invention can be utilized in processes, such as a double side container process, wherein no masking step is required.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method of selectively etching a layer of borophosphosilicate glass, comprising:
   providing a layered structure comprising a layer of tetraethyl orthosilicate on a semiconductor substrate, and a layer of borophosphosilicate glass atop said tetraethyl orthosidicate layer; and
   etching said borophosphosilicate glass layer with an etchant comprising an organic acid and a fluoride-containing solution.

2. The method of claim 1, wherein said organic acid is selected from the group consisting of acetic acid, formic acid, and oxalic acid.

3. The method of claim 1, wherein said fluoride-containing solution is selected from the group consisting of hydrofluoric acid and ammonium fluoride.

4. The method of claim 1, wherein said organic acid comprises 99.7% acetic acid by weight in water and said fluoride-containing solution comprises 49% hydrofluoric acid by weight in water.

5. The method of claim 4, wherein said acetic acid is in a volumetric ratio with said hydrofluoric acid from between about 1:1 to 500:1.

6. The method of claim 5, wherein said acetic acid is in a volumetric ratio with said hydrofluoric acid at about 10:1 to about 100:1.

7. A. The method of claim 1, wherein said organic acid comprises 99.7% acetic acid by weight in water and said fluoride-containing solution comprises 40% ammonium fluoride acid by weight in water.

8. The method of claim 1, wherein said etchant includes a selectivity ratio of borophosphosilicate glass to tetraethyl orthosilicate between about 27:1 and 55:1.

9. A method of selectively etching an opening:
   providing a layered structure comprising a layer of tetraethyl orthosilicate on a semiconductor substrate, and a layer of borophosphosilicate glass atop said tetraethyl orthosilicate layer;
   patterning a mask layer on said borophosphosilicate glass layer;
   etching said borophosphosilicate glass layer with an etchant comprising an organic acid and a fluoride-containing solution; and
   etching said tetraethyl orthosilicate layer to expose a portion of said semiconductor substrate.

10. The method of claim 9, wherein said organic acid is selected from the group consisting of acetic acid, formic acid, and oxalic acid.

11. The method of claim 9, wherein said fluoride-containing solution is selected from the group consisting of hydrofluoric acid and ammonium fluoride.

12. The method of claim 9, wherein said organic acid comprises 99.7% acetic acid by weight in water and said fluoride-containing solution comprises 49% hydrofluoride acid by weight in water.

13. The method of claim 12, wherein said acetic acid is in a volumetric ratio with said hydrofluoric acid from between about 1:1 to 500:1.

14. The method of claim 13, wherein said acetic acid is in a volumetric ratio with said hydrofluoric acid at about 10:1 to about 100:1.

15. The method of claim 9, wherein said organic acid comprises 99.7% acetic acid by weight in water and said fluoride-containing solution comprises 40% ammonium fluoride acid by weight in water.

16. The method of claim 9, wherein said etchant solution includes a selectivity ratio of borophosphosilicate glass to tetraethyl orthosilicate between about 27:1 and 55:1.

* * * * *

UNITED STATES PATENT AND TRADEMARK OFFICE
CERTIFICATE OF CORRECTION

PATENT NO. : 6,232,232 B1  Page 1 of 1
APPLICATION NO. : 09/056323
DATED : May 15, 2001
INVENTOR(S) : Whonchee Lee and Kevin J. Torek It is certified that error appears in the above-identified patent and that said Letters Patent is hereby corrected as shown below:

COLUMN 1, LINE 23, change "Complimentary" to --Complementary--
COLUMN 3, LINE 6, change "substrate 100" to --substrate 102--

CLAIM 1, COLUMN 3, LINE 29, change "orthosidicate" to --orthosilicate--
CLAIM 12, COLUMN 4, LINE 31, change "hydrofluoride" to --hydrofluoric--
CLAIM 16, COLUMN 4, LINE 44, change "etchant solution" to --etchant--

Signed and Sealed this

Twenty-eighth Day of November, 2006

JON W. DUDAS
*Director of the United States Patent and Trademark Office*